US012660613B2

(12) United States Patent
Stirrett et al.

(10) Patent No.: US 12,660,613 B2
(45) Date of Patent: Jun. 16, 2026

(54) SEMICONDUCTOR DEVICES INCLUDING METAL WIRE PAIRS

(71) Applicant: Advanced Micro Devices, Inc., Santa Clara, CA (US)

(72) Inventors: Douglas Stirrett, R. Collins, CO (US); Thomas Michael Daum, Granite Falls, NC (US); Jeffrey Lucas, R. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 383 days.

(21) Appl. No.: 18/530,697

(22) Filed: Dec. 6, 2023

(65) Prior Publication Data

US 2025/0192024 A1 Jun. 12, 2025

(51) Int. Cl.
| | |
|---|---|
| *H10W 20/40* | (2026.01) |
| *H10D 1/68* | (2025.01) |
| *H10W 20/42* | (2026.01) |
| *H10W 20/43* | (2026.01) |
| *H10W 70/05* | (2026.01) |

(52) U.S. Cl.
CPC ............ *H10W 20/496* (2026.01); *H10D 1/68* (2025.01); *H10W 20/42* (2026.01); *H10W 20/43* (2026.01); *H10W 70/093* (2026.01)

(58) Field of Classification Search
None
See application file for complete search history.

(56) References Cited

U.S. PATENT DOCUMENTS

2007/0297120 A1 * 12/2007 Ren ...................... H10D 84/811
257/E29.345

* cited by examiner

*Primary Examiner* — Anthony Ho
(74) *Attorney, Agent, or Firm* — Greenberg Traurig, LLP

(57) ABSTRACT

A semiconductor device includes a first metal layer including a plurality of first ground wire pairs alternating with a plurality of first power wire pairs and a second metal layer including a plurality of second ground wire pairs alternating with a plurality of second power wire pairs. A metal-insulator-metal capacitor (MIMCAP) is between the first metal layer and the second metal layer. A group of ground vias connects a pair of the first ground wire pairs with a pair of the second ground wire pairs. The group of ground vias can also connect to a ground plate of the MIMCAP. A group of power vias connects a pair of the first power wire pairs with a pair of the second power wire pairs. The group of power vias can also connect to a power plate of the MIMCAP. Various other methods and systems are also disclosed.

20 Claims, 6 Drawing Sheets

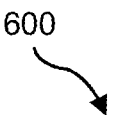

600

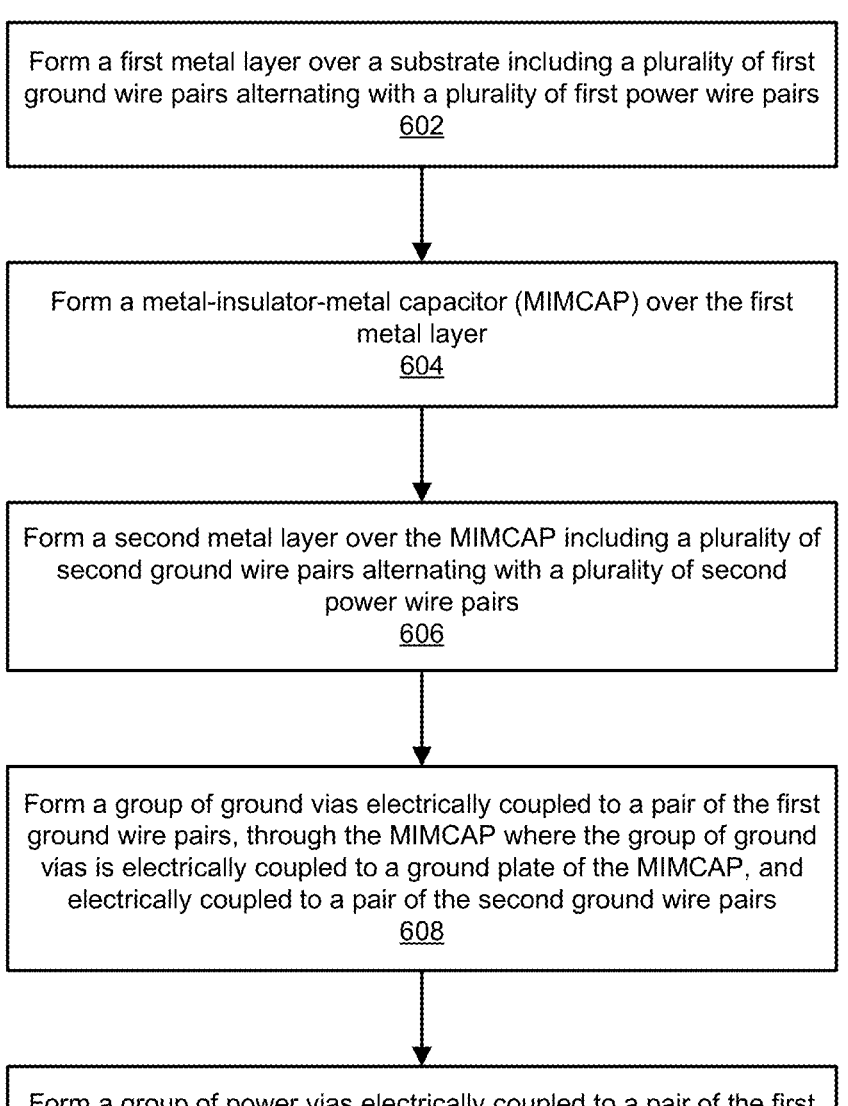

Form a first metal layer over a substrate including a plurality of first ground wire pairs alternating with a plurality of first power wire pairs
602

Form a metal-insulator-metal capacitor (MIMCAP) over the first metal layer
604

Form a second metal layer over the MIMCAP including a plurality of second ground wire pairs alternating with a plurality of second power wire pairs
606

Form a group of ground vias electrically coupled to a pair of the first ground wire pairs, through the MIMCAP where the group of ground vias is electrically coupled to a ground plate of the MIMCAP, and electrically coupled to a pair of the second ground wire pairs
608

Form a group of power vias electrically coupled to a pair of the first power wire pairs, through the MIMCAP where the group of power vias is electrically copuled to a power plate of the MIMCAP, and electrically coupled to a pair of the second power wire pairs
610

*FIG. 6*

SEMICONDUCTOR DEVICES INCLUDING METAL WIRE PAIRS

BACKGROUND

Semiconductor devices include integrated circuits that are operated with electrical signals. Metal layers can be used to transmit power from a power supply to components of the integrated circuits. For example, the metal layers can include ground wires alternating with power wires, which can be connected to the components of the integrated circuits.

During some operations of the semiconductor devices, electrical power fluctuates. For example, if many components are simultaneously used in a high-power operation, a voltage between the power to the ground can momentarily droop due to power being drawn by the components. Droop events, if severe enough, can result in operational deficiencies or even failures. Accordingly, some semiconductor devices are fabricated with a capacitor between metal layers that provide power to the components thereof. The capacitor can hold a charge that can be drawn in case of a high-power operation, thus avoiding or mitigating a voltage droop.

BRIEF DESCRIPTION OF THE DRAWINGS

The accompanying drawings illustrate a number of example implementations and are a part of the specification. Together with the following description, these drawings demonstrate and explain various principles of the present disclosure.

FIG. 6 is a flow chart illustrating a method of forming a semiconductor device, according to at least one embodiment of the present disclosure.

Figure 1:
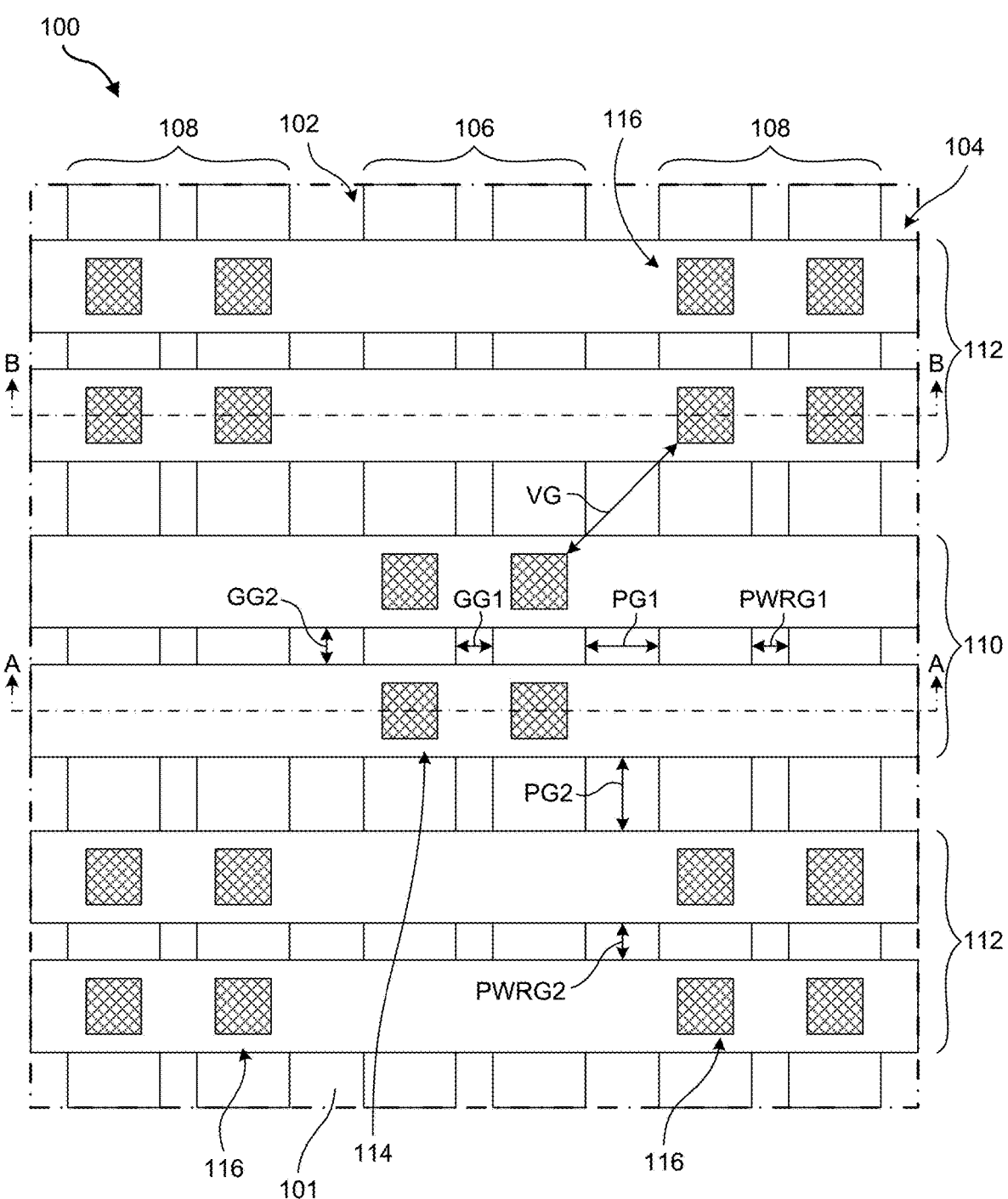
FIG. 1 is a plan view of a semiconductor device, according to at least one embodiment of the present disclosure.

Throughout the drawings, identical reference characters and descriptions indicate similar, but not necessarily identical, elements. While the examples described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to semiconductor devices that include metal layers and a capacitor between the metal layers. The metal layers can include ground wire pairs alternating with power wire pairs. Groups of ground vias (e.g., four ground vias) electrically connect a ground wire pair of one metal layer with a ground wire pair of the other metal layer. Likewise, groups of power vias (e.g., four power vias) electrically connect a power wire pair of one metal layer with a power wire pair of the other metal layer.

In some implementations, gaps between the metal wires of the metal layers can be tailored to increase a distance between a group of ground vias and a diagonally adjacent group of power vias. For example, a ground gap between ground wires of a ground wire pair and a power gap between power wires of a power wire pair can be smaller than a pair gap between ground wire pairs and power wire pairs. A resulting increased distance between the group of ground vias and diagonally adjacent group of power vias can improve manufacturing, such as by reducing a likelihood of unwanted shorting or other failures and/or by providing a wider margin of error between the groups of vias.

The following will provide, with reference to FIGS. 1-5, detailed descriptions of example semiconductor devices according to the present disclosure. Detailed descriptions of corresponding methods will also be provided in connection with FIG. 6.

In some aspects, the techniques described herein relate to a semiconductor device, including: a first metal layer including a plurality of first ground wire pairs alternating with a plurality of first power wire pairs; a second metal layer including a plurality of second ground wire pairs alternating with a plurality of second power wire pairs; a metal-insulator-metal capacitor (MIMCAP) between the first metal layer and the second metal layer, the MIMCAP including a first conductive plate, a second conductive plate, and an insulator between the first and second conductive plates; a group of ground vias connecting a pair of the first ground wire pairs in the first metal layer with a pair of the second ground wire pairs in the second metal layer; and a group of power vias connecting a pair of the first power wire pairs in the first metal layer with a pair of the second power wire pairs in the second metal layer.

In some aspects, the techniques described herein relate to a semiconductor device, wherein the first ground wire pairs and first power wire pairs extend parallel to each other in a first direction and the second ground wire pairs and second power wire pairs extend parallel to each other in a second direction transverse to the first direction.

In some aspects, the techniques described herein relate to a semiconductor device, wherein: the first ground wire pairs are separated from the first power wire pairs by a first pair gap; the ground wires of each of the first ground wire pairs are separated from each other by a first ground gap narrower than the first pair gap; and the power wires of each of the first power wire pairs are separated from each other by a first power gap narrower than the first pair gap.

In some aspects, the techniques described herein relate to a semiconductor device, wherein the first ground gap is substantially a same size as the first power gap.

In some aspects, the techniques described herein relate to a semiconductor device, wherein: the second ground wire pairs are separated from the second power wire pairs by a second pair gap; the ground wires of each of the second ground wire pairs are separated from each other by a second ground gap narrower than the second pair gap; and the power wires of each of the second power wire pairs are separated from each other by a second power gap narrower than the second pair gap.

In some aspects, the techniques described herein relate to a semiconductor device, wherein the second ground gap is substantially a same size as the second power gap.

In some aspects, the techniques described herein relate to a semiconductor device, wherein the first conductive plate of the MIMCAP includes a ground aperture through which the group of ground vias pass without electrically connecting to the first conductive plate.

In some aspects, the techniques described herein relate to a semiconductor device, wherein the group of ground vias electrically connect to the second conductive plate of the MIMCAP.

In some aspects, the techniques described herein relate to a semiconductor device, wherein the second conductive plate of the MIMCAP includes a power aperture through which the group of power vias pass without electrically connecting to the second conductive plate.

In some aspects, the techniques described herein relate to a semiconductor device, wherein the group of power vias electrically connect to the first conductive plate of the MIMCAP.

In some aspects, the techniques described herein relate to a semiconductor device, wherein the MIMCAP is separated from the first metal layer with a first dielectric material and from the second metal layer with a second dielectric material.

In some aspects, the techniques described herein relate to a semiconductor device, wherein the group of ground vias includes a group of four ground vias and the group of power vias includes a group of four power vias.

In some aspects, the techniques described herein relate to a semiconductor device, wherein the group of ground vias is positioned diagonal from the group of power vias in a staggered arrangement.

In some aspects, the techniques described herein relate to a semiconductor device, including: a first metal layer including a plurality of first ground wire pairs and a plurality of first power wire pairs; a second metal layer including a plurality of second ground wire pairs and a plurality of second power wire pairs; a metal-insulator-metal capacitor (MIMCAP) between the first metal layer and the second metal layer, the MIMCAP including a power plate and a ground plate separated by an insulator; a group of ground vias connecting a pair of the first ground wire pairs in the first metal layer with a pair of the second ground wire pairs in the second metal layer and with the ground plate of the MIMCAP; and a group of power vias connecting a pair of the first power wire pairs in the first metal layer with a pair of the second power wire pairs in the second metal layer and with the power plate of the MIMCAP.

In some aspects, the techniques described herein relate to a semiconductor device, wherein: the first ground wire pairs are separated from the first power wire pairs by a first pair gap; the ground wires of each of the first ground wire pairs are separated from each other by a first ground gap narrower than the first pair gap; and the power wires of each of the first power wire pairs are separated from each other by a first power gap narrower than the first pair gap.

In some aspects, the techniques described herein relate to a semiconductor device, wherein: the second ground wire pairs are separated from the second power wire pairs by a second pair gap; the ground wires of each of the second ground wire pairs are separated from each other by a second ground gap narrower than the second pair gap; and the power wires of each of the second power wire pairs are separated from each other by a second power gap narrower than the second pair gap.

In some aspects, the techniques described herein relate to a semiconductor device, wherein the plurality of first ground wire pairs alternate with the plurality of first power wire pairs in the first metal layer and the plurality of second ground wire pairs alternate with the plurality of second power wire pairs in the second metal layer.

In some aspects, the techniques described herein relate to a method of forming a semiconductor device, the method including: forming a first metal layer over a substrate, the first metal layer including a plurality of first ground wire pairs alternating with a plurality of first power wire pairs; forming a metal-insulator-metal capacitor (MIMCAP) over the first metal layer; forming a second metal layer over the MIMCAP, the second metal layer including a plurality of second ground wire pairs alternating with a plurality of second power wire pairs; forming a group of ground vias electrically coupled to a pair of the first ground wire pairs in the first metal layer, through the MIMCAP, and electrically coupled to a pair of the second ground wire pairs in the second metal layer; and forming a group of power vias electrically coupled to a pair of the first power wire pairs of the first metal layer, through the MIMCAP, and electrically coupled to a pair of the second power wire pairs in the second metal layer.

In some aspects, the techniques described herein relate to a method, wherein: forming the group of ground vias includes forming four ground vias; and forming the group of power vias includes forming four power vias.

In some aspects, the techniques described herein relate to a method, wherein: forming the first metal layer includes: forming a first pair gap between the first ground wire pairs and the first power wire pairs; forming a first ground gap between the ground wires of each of the first ground wire pairs, the first ground gap being narrower than the first pair gap; and forming a first power gap between the power wires of each of the first power wire pairs, the first power gap being narrower than the first pair gap; and forming the second metal layer includes: forming a second pair gap between the second ground wire pairs and the second power wire pairs; forming a second ground gap between the ground wires of each of the second ground wire pairs, the second ground gap being narrower than the second pair gap; and forming a second power gap between the power wires of each of the second power wire pairs, the second power gap being narrower than the second pair gap.

Figure 2:
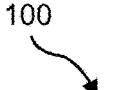
FIG. 2 is a cross-sectional side view of the semiconductor device of FIG. 1, taken through line A-A of FIG. 1, according to at least one embodiment of the present disclosure.
Figure 2:
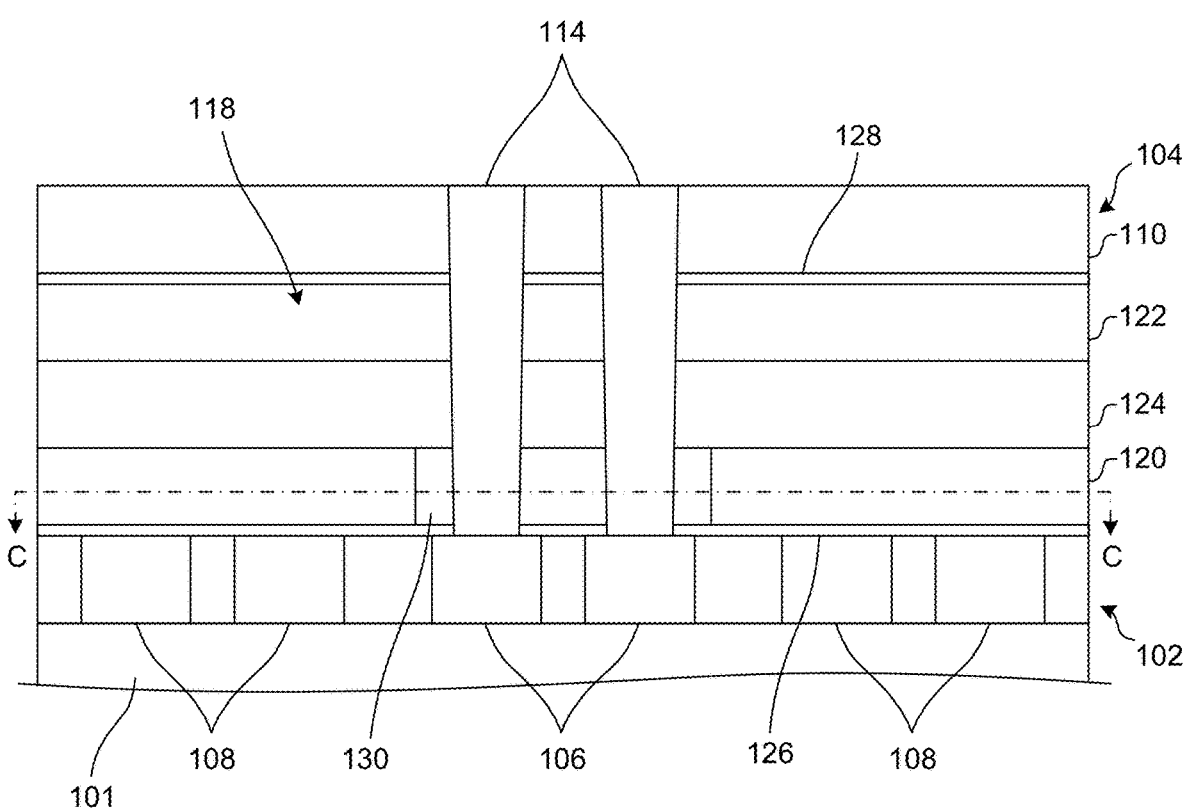

FIG. 1 is a plan view of a semiconductor device 100, according to at least one embodiment of the present disclosure. FIG. 2 is a cross-sectional side view of the semiconductor device 100 of FIG. 1, taken through line A-A of FIG. 1.

As illustrated in FIG. 1, the semiconductor device 100 includes a substrate 101, a first metal layer 102 over the substrate, and a second metal layer 104 over the first metal layer 102. By way of example and not limitation, the substrate 101 can be or include a semiconductor substrate (e.g., a silicon-based substrate), such as integrated circuitry for a semiconductor memory device and/or a semiconductor processor device.

The first metal layer 102 includes a plurality of first ground wire pairs 106 alternating with a plurality of first power wire pairs 108. The first ground wire pairs 106 and first power wire pairs 108 can be separated from each other with an electrically insulating material. The second metal layer 104 includes a plurality of second ground wire pairs 110 alternating with a plurality of second power wire pairs 112. The second ground wire pairs 110 and second power wire pairs 112 can be separated from each other with an electrically insulating material (shown as transparent in FIG. 1 to better view underlying components).

For example, the first ground wire pairs 106 and the first power wire pairs 108 can extend parallel to each other in a first direction (e.g., left-and-right in the view of FIG. 1) and the second ground wire pairs 110 and the second power wire pairs 112 can extend parallel to each other in a second direction (e.g., up-and-down in the view of FIG. 1) that is transverse (e.g., perpendicular) to the first direction.

A group of ground vias 114 connects (e.g., electrically connects) a pair of the first ground wire pairs 106 in the first metal layer 102 to a pair of the second ground wire pairs 110 in the second metal layer 104. Likewise, a group of power vias 116 connects (e.g., electrically connects) a pair of the first power wire pairs 108 in the first metal layer 102 to a pair of the second power wire pairs 112 in the second metal layer 104. By way of example and as shown in FIG. 1, the group of ground vias 114 can include four ground vias 114 and the group of power vias 116 can include four power vias 116, one for each intersection between the respective wires.

As illustrated in FIG. 1, the group of ground vias 114 is positioned diagonal from the group of power vias 116 in a staggered arrangement. In FIG. 1, a portion of the semiconductor device 100 is shown including one group of ground vias 114 near four groups of power vias 116. However, the semiconductor device 100 can include many groups of ground vias 114 diagonally positioned and staggered relative to many groups of power vias 116.

In the first metal layer 102, the first ground wire pairs 106 are separated from the first power wire pairs 108 by a first pair gap PG1. The ground wires of each of the first ground wire pairs 106 are separated from each other by a first ground gap GG1. The power wires of each of the first power wire pairs 108 are separated from each other by a first power gap PWRG1. The first ground gap GG1 and the first power gap PWRG1 are each narrower than the first pair gap PG1. In some examples, the first ground gap GG1 can be substantially a same size as the first power gap PWRG1.

Similarly, in the second metal layer 104, the second ground wire pairs 110 are separated from the second power wire pairs 112 by a second pair gap PG2. The ground wires of each of the second ground wire pairs 110 are separated from each other by a second ground gap GG2. The power wires of each of the second power wire pairs 112 are separated from each other by a second power gap PWRG2. The second ground gap GG2 and the second power gap PWRG2 are each narrower than the second pair gap PG2. In some examples, the second ground gap GG2 can be substantially a same size as the second power gap PWRG2.

As a result of this arrangement, a via gap VG between the group of ground vias 114 and a diagonally adjacent group of power vias 116 can be larger compared to a configuration with a smaller first pair gap PG1 and/or a smaller second pair gap PG2. For example, if the first ground gap GG1, first power gap PWRG1, and first pair gap PG1 were substantially the same as each other, and if the second ground gap GG2, second power gap PWRG2, and second pair gap PG2 were substantially the same as each other, the via gap VG would be smaller than the configuration shown in FIG. 1 and described above. The larger via gap VG of the disclosed configuration can result in fabrication improvements, such as by reducing a likelihood of shorting between the group of ground vias 114 and an adjacent group of power vias 116 and by providing additional space for a wider margin of error. On the other hand, shorting between the ground vias 114 and/or between the power vias 116 would not be a concern since the ground vias 114 are already shorted to each other through the first ground wire pairs 106 and/or second ground wire pairs 110 and the power vias 116 are already shorted to each other through the first power wire pairs 108 and/or second power wire pairs 112.

Turning to FIG. 2, a metal-insulator-metal capacitor (MIMCAP) 118 is positioned between the first metal layer 102 and the second metal layer 104. The MIMCAP 118 includes a first conductive plate 120, a second conductive plate 122, and an insulator 124 between the first conductive plate 120 and second conductive plate 122. In some examples, a first dielectric barrier 126 can be positioned between the first metal layer 102 and the first conductive plate 120 to electrically isolate the first metal layer 102 from the first conductive plate 120. Likewise, a second dielectric barrier 128 can be positioned between the second metal layer 104 and the second conductive plate 122.

In the example shown in FIG. 2, the group of ground vias 114 are electrically connected to the first ground wire pairs 106 of the first metal layer 102 and to the second ground wire pairs 110 of the second metal layer 104. In some examples, the group of ground vias 114 can also be electrically connected to the second conductive plate 122 of the MIMCAP 118. In these examples, the second conductive plate 122 can function as a ground plate of the MIMCAP 118. As illustrated in FIG. 2, the first conductive plate 120 of the MIMCAP 118 includes a ground aperture 130 therethrough for each group of ground vias 114. The group of ground vias 114 passes through the ground aperture 130. For example, the ground aperture 130 can include a dielectric material therein to electrically isolate the first conductive plate 120 from the group of ground vias 114.

Figure 3:
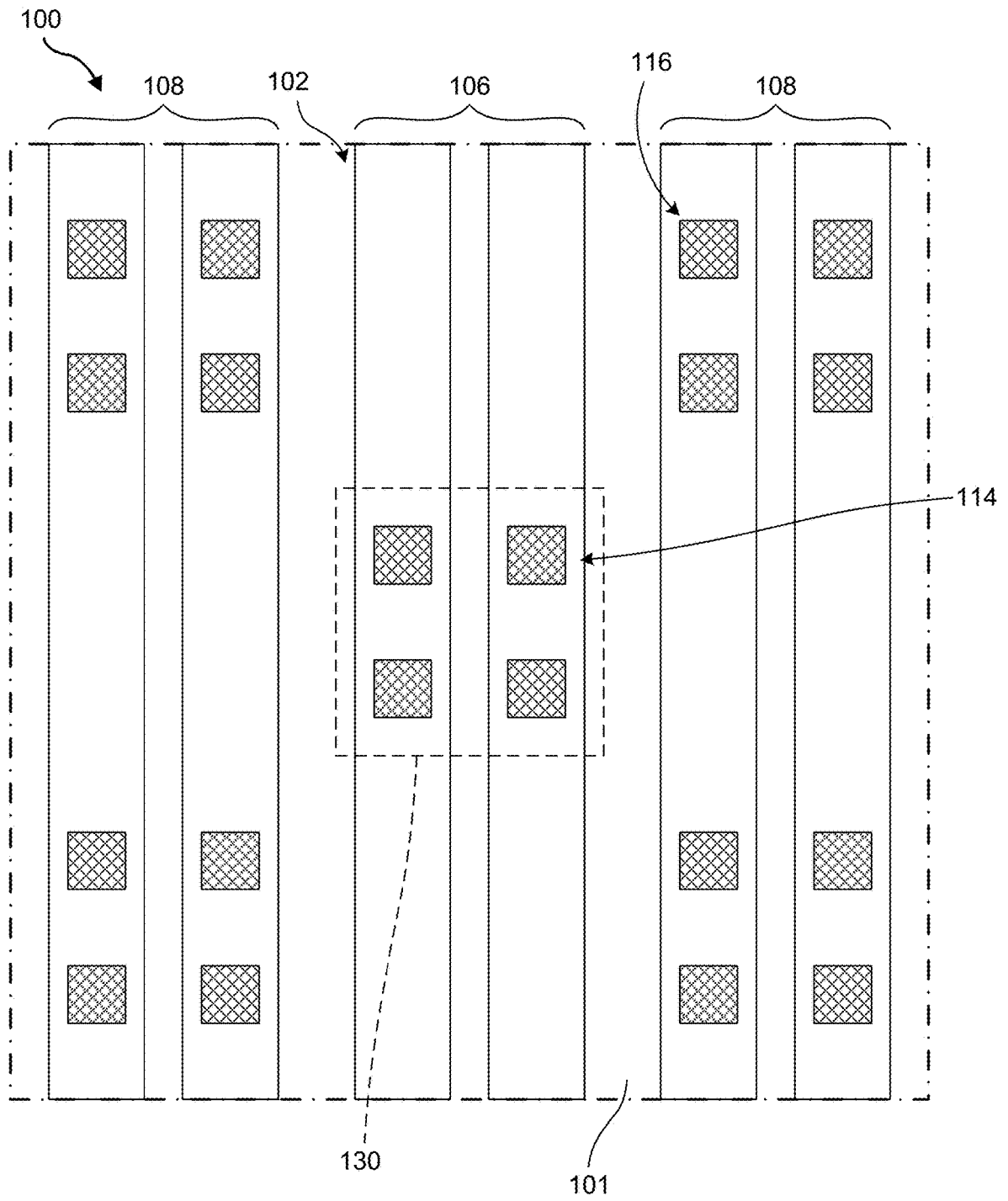
FIG. 3 is a cross-sectional top view of the semiconductor device of FIGS. 1 and 2, taken through line C-C of FIG. 2, according to at least one embodiment of the present disclosure.

FIG. 3 is a cross-sectional top view of the semiconductor device 100 of FIGS. 1 and 2, taken through line C-C of FIG. 2, according to at least one embodiment of the present disclosure. The first conductive plate 120 of FIG. 2 is transparent in FIG. 3 to better view underlying components, but the ground aperture 130 in the first conductive plate 120 is illustrated with a dashed line in FIG. 3. The group of ground vias 114 passes through the ground aperture 130. In the illustrated example, all four ground vias of the group of ground vias 114 pass through a single ground aperture 130.

Figure 4:
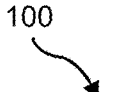
FIG. 4 is a cross-sectional side view of the semiconductor device of FIGS. 1-3, taken through line B-B of FIG. 1, according to at least one embodiment of the present disclosure.
Figure 4:
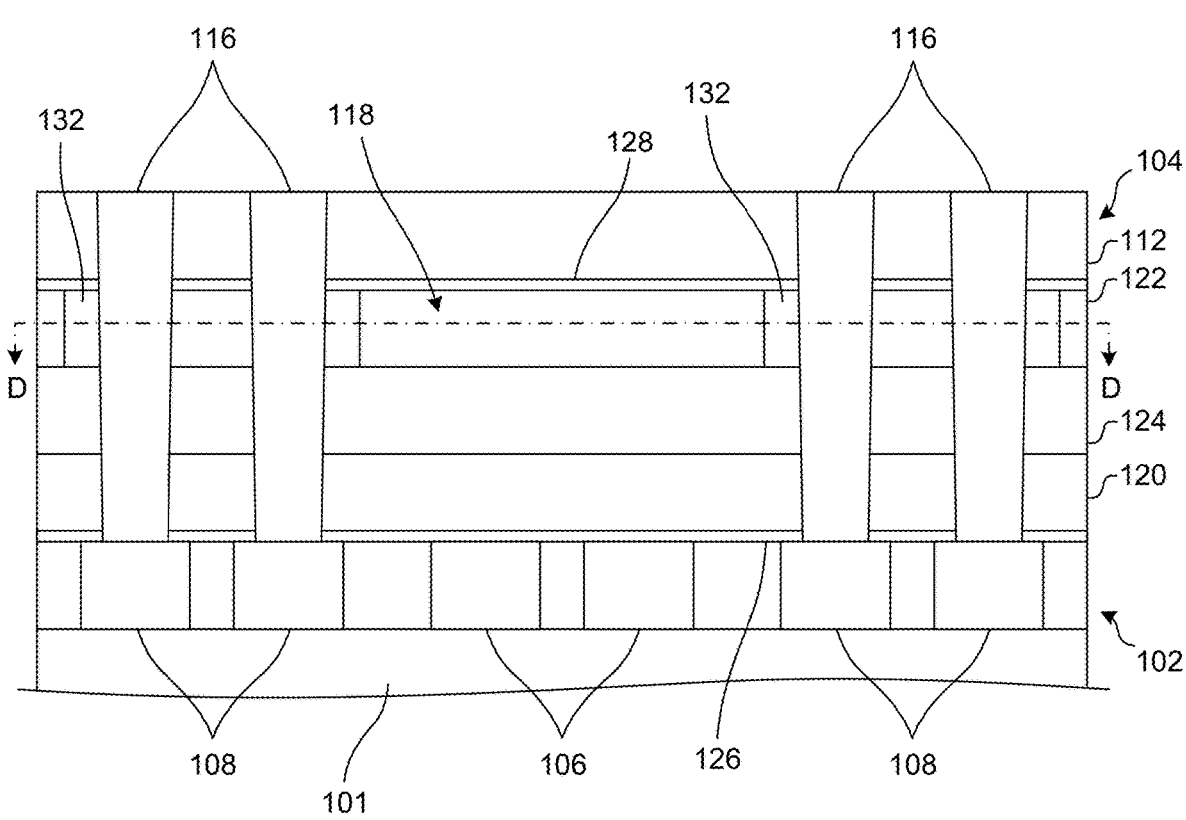

FIG. 4 is a cross-sectional side view of the semiconductor device 100 of FIGS. 1-3, taken through line B-B of FIG. 1, according to at least one embodiment of the present disclosure. In the example shown in FIG. 4, the group of power vias 116 are electrically connected to the first power wire pairs 108 of the first metal layer 102 and to the second power wire pairs 112 of the second metal layer 104. In some examples, the group of power vias 116 can also be electrically connected to the first conductive plate 120 of the MIMCAP 118. In these examples, the first conductive plate 120 can function as a power plate of the MIMCAP 118. As illustrated in FIG. 4, the second conductive plate 122 of the MIMCAP 118 includes a power aperture therethrough for each group of power vias 116. The group of power vias 116 passes through the power aperture 132. For example, the power aperture 132 can include a dielectric material therein to electrically isolate the second conductive plate 122 from the group of power vias 116.

Figure 5:
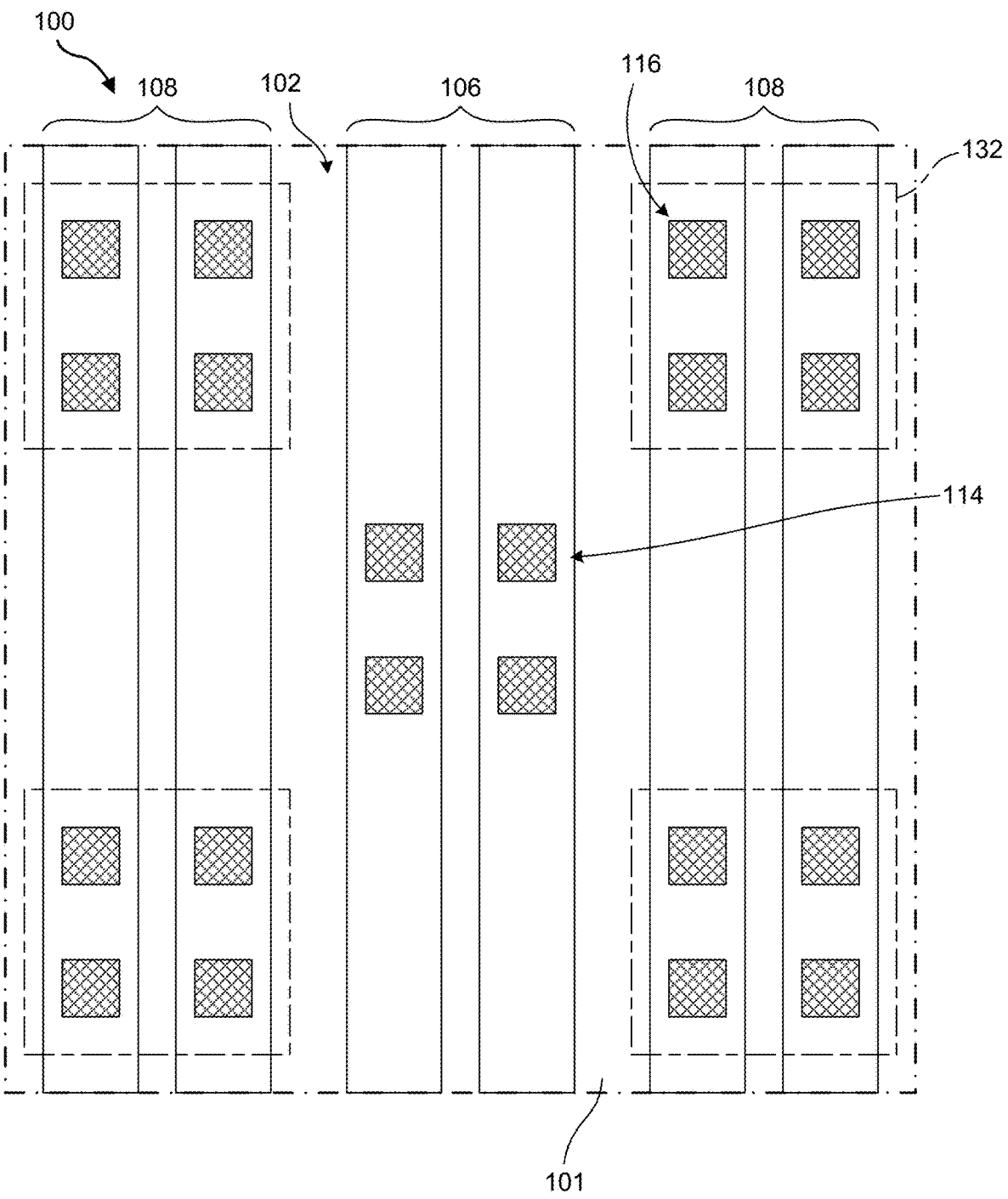
FIG. 5 is a cross-sectional top view of the semiconductor device of FIGS. 1-4, taken through line D-D of FIG. 4, according to at least one embodiment of the present disclosure.

FIG. 5 is a cross-sectional top view of the semiconductor device 100 of FIGS. 1-4, taken through line D-D of FIG. 4, according to at least one embodiment of the present disclosure. The first conductive plate 120, second conductive plate 122, and insulator 124 of FIG. 4 are transparent in FIG. 5 to better view underlying components, but the power apertures 132 in the second conductive plate 122 are illustrated with a long-short dashed line in FIG. 5. The groups of power vias 116 respectively pass through the power apertures 132. In the illustrated example, all four power vias of each group of power vias 116 pass through a single power aperture 132.

In the example shown in FIGS. 2-5, the first conductive plate 120 is configured to function as a power plate (e.g., the first conductive plate 120 is electrically connected to the group of power vias 116) and the second conductive plate 122 is configured to function as a ground plate (e.g., the second conductive plate 122 is electrically connected to the group of ground vias 114). However, the present disclosure is not so limited. In additional examples, the first conductive plate 120 can be configured to function as a ground plate (e.g., connected to the group of ground vias 114) and the second conductive plate 122 can be configured to function as a power plate (e.g., connected to the group of power vias 116).

FIG. 6 is a flow chart illustrating a method 600 of forming a semiconductor device, according to at least one embodiment of the present disclosure. At operation 602, a first metal layer is formed over a substrate. The first metal layer includes a plurality of first ground wire pairs alternating with a plurality of first power wire pairs. The first ground wire pairs and the first power wire pairs in the first metal layer can extend parallel to each other.

At operation 604, a MIMCAP is formed over the first metal layer. For example, a first conductive plate, a second conductive plate, and an insulator between the first conductive plate and second conductive plate can be formed. The MIMCAP can be electrically isolated from the first metal layer with a first dielectric barrier formed between the first metal layer and the first conductive plate. In some examples, ground apertures can be formed in the first conductive plate over portions of the first ground wire pairs of the first metal layer, and power apertures can be formed in the second conductive plate over portions of the first power wire pairs of the first metal layer.

In some implementations, forming the first metal layer can include forming a first pair gap between the first ground wire pairs and the first power wire pairs, a first ground gap between the ground wires of each of the first ground wire pairs, and a first power gap between the power wires of each of the first power wire pairs. The first ground gap and the first power gap can be narrower than the first pair gap.

At operation 606, a second metal layer is formed over the MIMCAP. The second metal layer includes a plurality of second ground wire pairs alternating with a plurality of second power wire pairs. The second ground wire pairs and the second power wire pairs in the second metal layer can extend parallel to each other, and transverse (e.g., perpendicular) to the first ground wire pairs and first power wire pairs of the first metal layer. The second metal layer can be electrically isolated from the MIMCAP with a second dielectric barrier formed between the MIMCAP and the second metal layer.

In some implementations, forming the second metal layer can include forming a second pair gap between the second ground wire pairs and the second power wire pairs, forming a second ground gap between the ground wires of each of the second ground wire pairs, and forming a second power gap between the power wires of each of the second power wire pairs. The second ground gap and the second power gap can be narrower than the second pair gap.

At operation 608, a group of ground vias is formed and electrically coupled to a pair of the first ground wire pairs in the first metal layer, through the MIMCAP where the group of ground vias is electrically coupled to a ground plate of the MIMCAP, and electrically coupled to a pair of the second ground wire pairs in the second metal layer. For example, a group of four ground vias can be formed, one ground via for each intersection between wires of the first ground wire pair and wires of the second ground wire pair. The group of ground vias can pass through the ground aperture formed in the first conductive plate of the MIMCAP. The group of ground vias can be electrically connected to the second conductive plate (e.g., a ground plate) of the MIMCAP and electrically isolated from the first conductive plate (e.g., a power plate) of the MIMCAP.

At operation 610, a group of power vias is formed and electrically coupled to a pair of the first power wire pairs in the first metal layer, through the MIMCAP where the group of power vias is electrically coupled to a power plate of the MIMCAP, and electrically coupled to a pair of the second power wire pairs in the second metal layer. For example, a group of four power vias can be formed, one power via for each intersection between wires of the first power wire pair and wires of the second power wire pair. The group of power vias can pass through the power aperture formed in the second conductive plate of the MIMCAP. The group of power vias can be electrically connected to the first conductive plate of the MIMCAP and electrically isolated from the second conductive plate of the MIMCAP (e.g., a ground plate).

Accordingly, implementations of the present disclosure can improve manufacturing and/or operation of semiconductor devices by providing a wider margin of error between adjacent (e.g., diagonally adjacent) groups of ground wire pairs and power wire pairs.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various implementations have been described and/or illustrated herein in the context of fully functional computing systems, one or more of these example implementations can be distributed as a program product in a variety of forms, regardless of the particular type of computer-readable media used to actually carry out the distribution. The implementations disclosed herein can also be implemented using modules that perform certain tasks. These modules can include script, batch, or other executable files that can be stored on a computer-readable storage medium or in a computing system. In some implementations, these modules can configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A semiconductor device, comprising:
a first metal layer including a plurality of first ground wire pairs alternating with a plurality of first power wire pairs;
a second metal layer including a plurality of second ground wire pairs alternating with a plurality of second power wire pairs;
a metal-insulator-metal capacitor (MIMCAP) between the first metal layer and the second metal layer, the MIMCAP including a first conductive plate, a second conductive plate, and an insulator between the first and second conductive plates;
a group of ground vias connecting a pair of the first ground wire pairs in the first metal layer with a pair of the second ground wire pairs in the second metal layer; and
a group of power vias connecting a pair of the first power wire pairs in the first metal layer with a pair of the second power wire pairs in the second metal layer.

2. The semiconductor device of claim 1, wherein the first ground wire pairs and first power wire pairs extend parallel to each other in a first direction and the second ground wire pairs and second power wire pairs extend parallel to each other in a second direction transverse to the first direction.

3. The semiconductor device of claim 1, wherein:
the first ground wire pairs are separated from the first power wire pairs by a first pair gap;
the ground wires of each of the first ground wire pairs are separated from each other by a first ground gap narrower than the first pair gap; and
the power wires of each of the first power wire pairs are separated from each other by a first power gap narrower than the first pair gap.

4. The semiconductor device of claim 3, wherein the first ground gap is substantially a same size as the first power gap.

5. The semiconductor device of claim 1, wherein:
the second ground wire pairs are separated from the second power wire pairs by a second pair gap;
the ground wires of each of the second ground wire pairs are separated from each other by a second ground gap narrower than the second pair gap; and
the power wires of each of the second power wire pairs are separated from each other by a second power gap narrower than the second pair gap.

6. The semiconductor device of claim 5, wherein the second ground gap is substantially a same size as the second power gap.

7. The semiconductor device of claim 1, wherein the first conductive plate of the MIMCAP comprises a ground aperture through which the group of ground vias pass without electrically connecting to the first conductive plate.

8. The semiconductor device of claim 7, wherein the group of ground vias electrically connect to the second conductive plate of the MIMCAP.

9. The semiconductor device of claim 1, wherein the second conductive plate of the MIMCAP comprises a power aperture through which the group of power vias pass without electrically connecting to the second conductive plate.

10. The semiconductor device of claim 9, wherein the group of power vias electrically connect to the first conductive plate of the MIMCAP.

11. The semiconductor device of claim 1, wherein the MIMCAP is separated from the first metal layer with a first dielectric material and from the second metal layer with a second dielectric material.

12. The semiconductor device of claim 1, wherein the group of ground vias comprises a group of four ground vias and the group of power vias comprises a group of four power vias.

13. The semiconductor device of claim 1, wherein the group of ground vias is positioned diagonal from the group of power vias in a staggered arrangement.

14. A semiconductor device, comprising:
a first metal layer including a plurality of first ground wire pairs and a plurality of first power wire pairs;
a second metal layer including a plurality of second ground wire pairs and a plurality of second power wire pairs;
a metal-insulator-metal capacitor (MIMCAP) between the first metal layer and the second metal layer, the MIMCAP including a power plate and a ground plate separated by an insulator;
a group of ground vias connecting a pair of the first ground wire pairs in the first metal layer with a pair of the second ground wire pairs in the second metal layer and with the ground plate of the MIMCAP; and
a group of power vias connecting a pair of the first power wire pairs in the first metal layer with a pair of the second power wire pairs in the second metal layer and with the power plate of the MIMCAP.

15. The semiconductor device of claim 14, wherein:
the first ground wire pairs are separated from the first power wire pairs by a first pair gap;
the ground wires of each of the first ground wire pairs are separated from each other by a first ground gap narrower than the first pair gap; and
the power wires of each of the first power wire pairs are separated from each other by a first power gap narrower than the first pair gap.

16. The semiconductor device of claim 14, wherein:
the second ground wire pairs are separated from the second power wire pairs by a second pair gap;
the ground wires of each of the second ground wire pairs are separated from each other by a second ground gap narrower than the second pair gap; and
the power wires of each of the second power wire pairs are separated from each other by a second power gap narrower than the second pair gap.

17. The semiconductor device of claim 14, wherein the plurality of first ground wire pairs alternate with the plurality of first power wire pairs in the first metal layer and the plurality of second ground wire pairs alternate with the plurality of second power wire pairs in the second metal layer.

18. A method of forming a semiconductor device, the method comprising:

forming a first metal layer over a substrate, the first metal layer including a plurality of first ground wire pairs alternating with a plurality of first power wire pairs;

forming a metal-insulator-metal capacitor (MIMCAP) over the first metal layer;

forming a second metal layer over the MIMCAP, the second metal layer including a plurality of second ground wire pairs alternating with a plurality of second power wire pairs;

forming a group of ground vias electrically coupled to a pair of the first ground wire pairs in the first metal layer, through the MIMCAP, and electrically coupled to a pair of the second ground wire pairs in the second metal layer; and forming a group of power vias electrically coupled to a pair of the first power wire pairs of the first metal layer, through the MIMCAP, and electrically coupled to a pair of the second power wire pairs in the second metal layer.

19. The method of claim 18, wherein:

forming the group of ground vias comprises forming four ground vias; and forming the group of power vias comprises forming four power vias.

20. The method of claim 18, wherein:

forming the first metal layer comprises:

forming a first pair gap between the first ground wire pairs and the first power wire pairs;

forming a first ground gap between the ground wires of each of the first ground wire pairs, the first ground gap being narrower than the first pair gap; and forming a first power gap between the power wires of each of the first power wire pairs, the first power gap being narrower than the first pair gap; and forming the second metal layer comprises:

forming a second pair gap between the second ground wire pairs and the second power wire pairs;

forming a second ground gap between the ground wires of each of the second ground wire pairs, the second ground gap being narrower than the second pair gap; and forming a second power gap between the power wires of each of the second power wire pairs, the second power gap being narrower than the second pair gap.

* * * * *